United States Patent
Ball

(10) Patent No.: US 6,624,059 B2
(45) Date of Patent: *Sep. 23, 2003

(54) METHOD OF IMPROVING INTERCONNECT OF SEMICONDUCTOR DEVICES BY UTILIZING A FLATTENED BALL BOND

(75) Inventor: Michael B. Ball, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/197,271

(22) Filed: Jul. 15, 2002

(65) Prior Publication Data

US 2002/0177296 A1 Nov. 28, 2002

Related U.S. Application Data

(63) Continuation of application No. 09/684,448, filed on Oct. 6, 2000, now Pat. No. 6,420,256, which is a continuation of application No. 09/391,638, filed on Sep. 7, 1999, now Pat. No. 6,165,887, which is a continuation of application No. 08/840,604, filed on Apr. 22, 1997, now Pat. No. 5,976,964.

(51) Int. Cl.[7] .............................. H01L 21/44
(52) U.S. Cl. ...................... 438/612; 438/613; 438/614; 438/617
(58) Field of Search ................. 438/612–618; 257/737, 779, 784

(56) References Cited

U.S. PATENT DOCUMENTS

| | | |
|---|---|---|
| 4,176,443 A | 12/1979 | Iannuzzi et al. |
| 4,486,945 A | 12/1984 | Aigoo |
| 4,733,289 A | 3/1988 | Tsurumaru |
| 4,750,666 A | 6/1988 | Neugebauer et al. |
| 4,821,148 A | 4/1989 | Kobayashi et al. |
| 5,011,066 A * | 4/1991 | Thompson |
| 5,058,798 A | 10/1991 | Yamazaki et al. |
| 5,101,263 A | 3/1992 | Kitano et al. |
| 5,132,772 A | 7/1992 | Fetty |
| 5,229,646 A | 7/1993 | Tsumura |
| 5,235,212 A | 8/1993 | Shimizu et al. |
| 5,298,793 A | 3/1994 | Kotani et al. |
| 5,328,079 A | 7/1994 | Mathew et al. |
| 5,343,064 A | 8/1994 | Spangler et al. |
| 5,371,654 A | 12/1994 | Beaman et al. |
| 5,420,073 A | 5/1995 | DiGiacomo et al. |
| 5,430,329 A | 7/1995 | Harada et al. |
| 5,455,195 A | 10/1995 | Ramsey et al. |
| 5,478,973 A | 12/1995 | Yoon et al. |
| 5,492,863 A | 2/1996 | Higgins, III |
| 5,550,083 A | 8/1996 | Koide et al. |
| 5,559,054 A | 9/1996 | Adamjee |
| 5,656,830 A | 8/1997 | Zechman |
| 5,740,956 A | 4/1998 | Seo et al. |
| 5,764,486 A | 6/1998 | Pendse |
| 5,842,628 A | 12/1998 | Nomoto et al. |
| 5,976,964 A | 11/1999 | Ball |
| 6,165,887 A | 12/2000 | Ball |

FOREIGN PATENT DOCUMENTS

| | | |
|---|---|---|
| EP | 544915 A1 * | 7/1993 |
| JP | 1-293626 | 11/1989 |
| JP | 4-294552 | 10/1992 |

* cited by examiner

Primary Examiner—Ha Tran Nguyen
(74) Attorney, Agent, or Firm—TraskBritt

(57) ABSTRACT

A method of forming a semiconductor device assembly comprising forming a wire bump on at least one bond pad on the active surface of a semiconductor device and connecting one end of a wire to the wire bump using a wire bond. The wire bump may be flattened before connecting one end of a wire thereto.

4 Claims, 4 Drawing Sheets

METHOD OF IMPROVING INTERCONNECT OF SEMICONDUCTOR DEVICES BY UTILIZING A FLATTENED BALL BOND

CROSS-REFERENCE TO RELATED APPLICATIONS

This application is a continuation of application Ser. No. 09/684,448, filed Oct. 6, 2000, now U.S. Pat. No. 6,420,256 B1, issued Jul. 16, 2002, which is a continuation of application Ser. No. 09/391,638, filed Sep. 7, 1999, now U.S. Pat. No. 6,165,887, issued Dec. 26, 2000, which is a continuation of application Ser. No. 08/840,604, filed Apr. 22, 1997, now U.S. Pat. No. 5,976,964, issued Nov. 2, 1999.

BACKGROUND OF THE INVENTION

1. Field of the Invention

The present invention relates to improved wire bonds with the bond pads of semiconductor devices and the lead frames associated therewith. More specifically, the present invention relates to improved wire bonds with ball bumps previously made on the bond pads of semiconductor devices.

2. State of the Art

In semiconductor device manufacture, a single semiconductor die (or chip) is typically mounted within a sealed package. In general, the package protects the semiconductor die from damage and from contaminants in the surrounding environment. In addition, the package provides a substantial lead system for connecting the electrical devices formed on the die to a printed circuit board or other external circuitry.

Each semiconductor die has a lower surface (commonly referred to as the back of the die) that is devoid of circuitry, and an upper surface (commonly referred to as the active surface or face of the die) having integrated circuitry constructed thereon. The integrated circuitry is electrically accessible via bond pads located on the active surface of the semiconductor die which may be arranged in a wide variety of patterns, such as around the periphery of the semiconductor die, the center of the semiconductor die, or both, etc.

Typically, the initial component in the packaging process is a lead frame. The lead frame is a metal frame which supports the semiconductor die for packaging and provides the leads for the final semiconductor package. A typical lead frame strip is produced from metal sheet stock (usually a copper, copper alloy, alloy 42, etc.) and is adapted to mount the semiconductor die.

A conventional lead frame has the semiconductor die adhesively mounted on a die paddle of the lead frame while the lead fingers (leads) extend around the periphery of the semiconductor die (the edges) terminating adjacent thereto. Subsequently, wire bonds are made to connect the bond pads on the active surface of the semiconductor die to the appropriated lead finger of the lead frame. After the wire bonding operation, the lead frame and semiconductor die are encapsulated in a transfer die molding process. After encapsulation, the lead frame is trimmed with the remainder of the individual lead fingers being formed into the desired packaging configuration.

One of the problems associated with conventional lead frame configurations is that, with the decreasing size of the semiconductor die and the increasing amount of circuitry included in the semiconductor die, it is necessary to connect an ever-increasing number of bond pads on the active surface of the semiconductor die, with an ever-increasing number of lead fingers of the lead frame. This requires that the bond pads on the semiconductor die be located on smaller pitch spacings and the width of the lead fingers be smaller. This, in turn, leads to smaller wire bonds on both the bond pads of the semiconductor die and the lead fingers of the lead frame which causes the wire bonds to be more highly stressed by the forces placed on them.

In a Leads-Over-Chip (LOC) type lead frame configuration for an integrated circuit semiconductor device, the lead fingers of the lead frame extend over the active surface of the semiconductor die being insulated therefrom by tape which is adhesively bonded to the active surface of the semiconductor die and the bottom of the lead fingers. In this manner, the semiconductor die is supported directly from the lead fingers of the lead frame. Electrical connections are made between the lead finger of the lead frame and the bond pads on the active surface of the semiconductor die by way of wire bonds extending therebetween. After wire bonding, the lead frame and semiconductor die are encapsulated in suitable plastic material. Subsequently, the lead fingers are trimmed and formed to the desired configuration to complete the packaged semiconductor device assembly.

One of the shortcomings of the prior art LOC semiconductor die assemblies is that the tape used to bond to the lead fingers of the lead frame does not adequately lock the lead fingers in position for the wire bonding process. At times, the adhesive on the tape is not strong enough to fix or lock the lead fingers in position for wire bonding as the lead fingers pull away from the tape before wire bonding. Alternately, the lead fingers will pull away from the tape after wire bonding of the semiconductor die but before encapsulation of the semiconductor die and lead frame either causing shorts between adjacent wire bonds or the wire bonds to pull loose from either the bond pads of the semiconductor die or lead finger of the lead frame. As before with conventional lead frames, with the decreasing size of the semiconductor die and the increasing amount of circuitry included in the semiconductor die, it is necessary to connect an ever-increasing number of bond pads on the active surface of the semiconductor die with an ever-increasing number of lead fingers of the lead frame. This requires that the bond pads on the semiconductor die be located on smaller pitch spacings and that the width of the lead fingers be smaller. This, in turn, leads to smaller wire bonds on both the bond pads and the lead fingers of the lead frame which cause the wire bonds to be more highly stressed by the forces placed on them.

Therefore, a need exists for increased strength wire bonds between the lead fingers of a lead frame and the bond pads of a semiconductor die, particularly as the size of the semiconductor die, the size of the bond pads thereon, the size of the lead fingers connected by wire bonds to bond pads, and the pitch thereof all decrease.

It is known in the art to form bumps on the bond pads of semiconductor dice using wire bonding apparatus for subsequent Tape Automated Bonding (TAB) or flip-chip (face-down) assembly of bare chip dice to a substrate. Such is illustrated in U.S. Pat. Nos. 4,750,666 and 5,058,798. It is also known to repair defective or broken wire bonds to bond pads of semiconductor dice by forming a flattened pad over the remaining portion of the wire and, subsequently, bonding the end of another wire thereover. Such is illustrated in U.S. Pat. No. 5,550,083. Other types of wire bonding operations on the bond pads of a semiconductor die are illustrated in U.S. Pat. Nos. 5,235,212, 5,298,793, 5,343,064, 5,371,654, and 5,492,863.

SUMMARY OF THE INVENTION

The present invention relates to improved wire bonds with the bond pads of semiconductor devices and the lead fingers of lead frames. More specifically, the present invention relates to improved wire bonds with ball bonds previously made on the bond pads of semiconductor devices and/or lead fingers of lead frames.

The present invention will be better understood when the drawings are taken in conjunction with the following description of the invention.

DETAILED DESCRIPTION OF THE INVENTION

Figure 1:
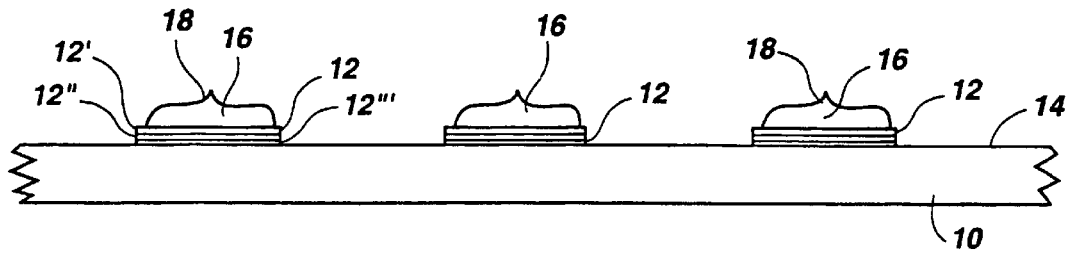
FIG. 1 is a cross-sectional view of a semiconductor device having a plurality of bond pads thereon with wire bumps formed thereon.

Referring to drawing FIG. 1, a semiconductor device 10 is illustrated having a plurality of bond pads 12 located on the active surface 14 thereof. The semiconductor device 10 may be of any desired type having any desired configuration of bond pads 12 connected to the active circuitry therein. As illustrated, a wire bump 16 is secured to the bond pads 12 of the semiconductor device 10. The wire bumps 16 have been formed or secured to the bond pads 12 by any desired well known wire bonding apparatus used in the industry. The wire bumps may be formed using any desired type of wire, such as aluminum, copper, copper alloy, aluminum-copper alloy, gold, silver, gold-silver alloy, platinum, etc., although gold wire is preferred to be used as gold does not form an oxide after the deposition on the bond pad 12 as would aluminum, silver, etc.

During the formation of the wire bump 16 on the bond pad 12, the wire bump 16 is formed on the bond pad 12, typically, as heat associated with the bond is a consideration, by the thermosonic bonding of a piece of wire from a supply thereof using an ultrasonic energy source to the bond pad 12 with the wire being terminated after the thermosonic bonding to the bond pad 12 by pulling the piece of wire bonded to the bond pad 12 from the supply of remaining wire, usually leaving the bump slightly deformed as depicted at the deformation 18. Alternately, if heat associated with the bond is not a problem, a temperature of 300° C.–400° C. can be tolerated, and a thermo-compression type wire bonding apparatus may be used, but is not preferred.

If desired, the bond pad 12 may be comprised of layers of different metals to enhance bonding characteristics. For instance, layer 12''' is a metal which has an affinity for bonding to the semiconductor material forming the semiconductor device 10. Typically, the layer 12''' would be of aluminum. The layer 12'' is an intermediate layer of metal to help prevent intermetallic compounds from forming between the layer 12''' and the wire bump 16. For instance, the layer 12'' commonly comprises a layer of chromium. The layer 12' is a metal layer which has an affinity for bonding to the wire bump 16 and the layer 12''. If a gold wire bump 16 is formed, the metal layer 12' is typically a gold metal layer. In this manner by forming the bond pad 12 of multiple layers of metal, a strong bond between the wire bump 16 and the bond pad 12 may be formed, particularly since gold does not form an oxide coating after the deposition thereof to affect any subsequent bond of material thereto.

After the wire bump 16 has been formed on the bond pad 12, since the wire bump 16 is typically deformed as illustrated at 18, it is preferred to flatten the wire bump 16 to form a flattened surface thereon before subsequently forming a wire bond thereto.

Figure 2:
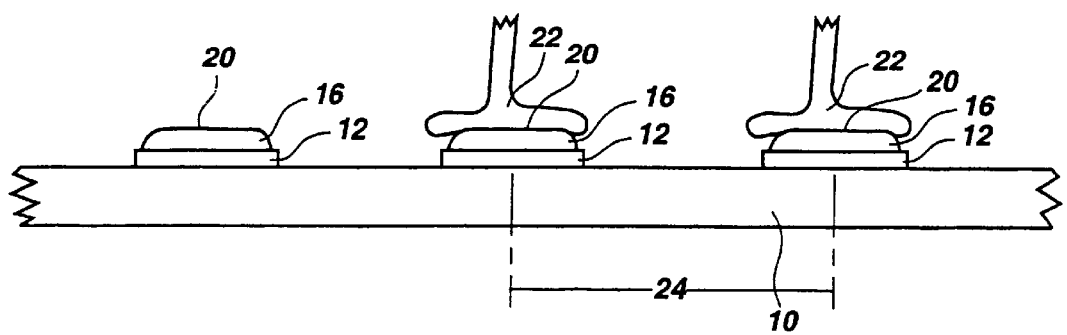
FIG. 2 is a cross-sectional view of a semiconductor device having a plurality of bond pads thereon with wire bumps formed thereon and wire bonds formed on the wire bumps.

Referring to drawing FIG. 2, a bond pad 12 is illustrated having a wire bump 16 located thereon having a flattened upper surface 20 located thereon. Additionally shown are bond pads 12 having flattened wire bumps 16 thereon having, in turn, flattened upper surfaces 20 thereon and wire bonds 22 attached thereto. The wire bonds 22 may be of a larger diameter or size than that of the wire bumps 16, thereby allowing the bond pads 12 of the semiconductor device 10 to be placed more closely together on a smaller pitch 24 or spacing on the semiconductor device 10.

Figure 3:
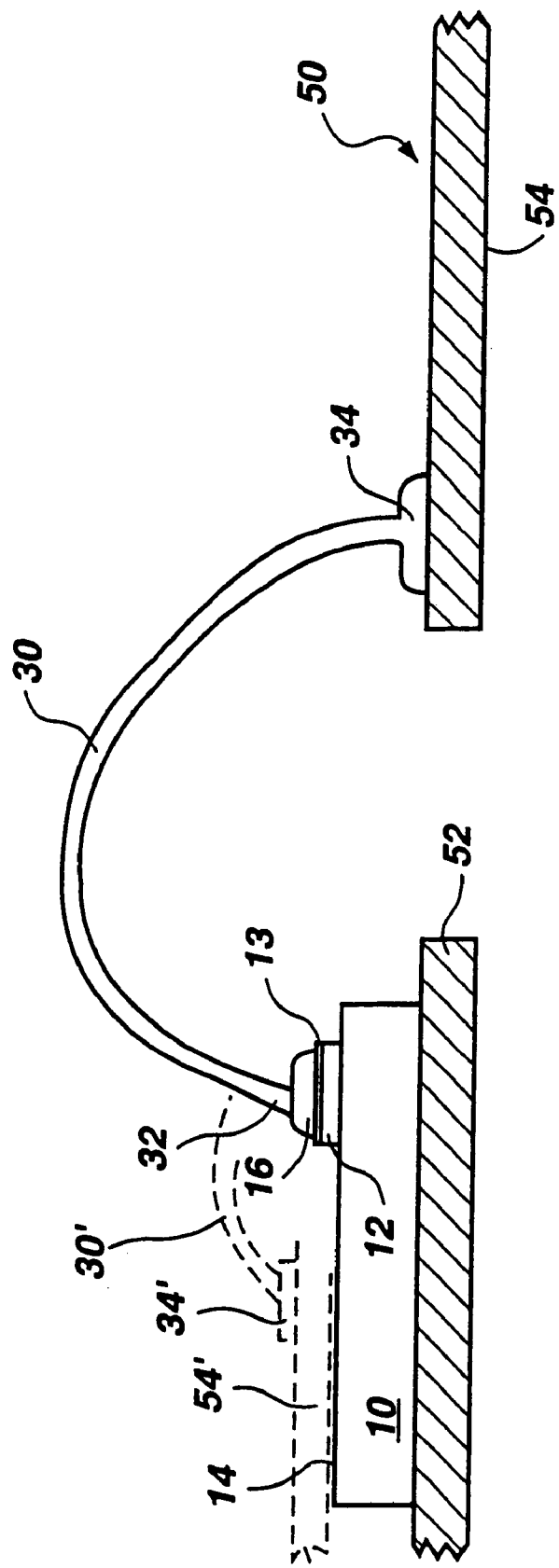
FIG. 3 is a cross-sectional view of a semiconductor device having a plurality of bond pads thereon with wire bumps formed thereon and a wire bond formed on the wire bump extending to a lead finger of a lead frame.

Referring to drawing FIG. 3, a semiconductor device 10 is illustrated being secured to a die paddle 52 of a conventional lead frame 50, shown in cross-section. The semiconductor device 10 has one or more bond pads 12 in any desired pattern or configuration located on the active surface 14 thereof. Each bond pad 12 also has a wire bump 16 formed thereon, as previously described hereinabove. The conventional lead frame 50 also includes a plurality of lead fingers 54 which extends and terminates adjacent a side of the semiconductor device 10. Further illustrated is a wire 30 which is bonded by means of a wedge-type wire bond 32 to the wire bump 16 located on the bond pad 12 while the other end of the wire 30 is bonded by means of a ball-type wire bond 34 to the end of the lead finger 54 of the conventional lead frame 50. As illustrated, the bond pad 12 may include a coating 13 of suitable material, as described herein, to help facilitate the bonding of the wire bump 16 and the wedge-type bond 32 thereto. It should be appreciated that the wire bonding of the wire 30 by a wedge-type bond 32 to the wire bump 16 on the bond pad 12, and the ball-type bond 34 to the lead finger 54, is the opposite of the typical wire bonding process using well known conventional wire bonding equipment. Since the bond pad 12 includes a wire bump 16 thereon, a high strength, wedge-type bond may be used thereon which results in a satisfactory wire bond to the bond pad as the wire bump 16 provides a bonding environment to yield a high strength wire bond. Also, since a wedge-type wire bond 32 is used to form the wire bond of the wire 30 and the bond pad 12, a high strength, ball-type wire bond 34 may be used to form a high strength wire bond to the lead finger 54 using the typical wire bonding process and equipment. In this manner, as it is commonly known in the industry, the potential problem of a "second-bond, no-stick" wire bond of the wire 30 with respect to the lead finger is minimized. This technique offers the advantage of using lead frames where the lead fingers or portions thereof do not need to be plated with metals to enhance the wire bonding of a wire thereto. Alternately, as illustrated in dotted lines in drawing FIG. 3, a leads-over-chip (LOC) type lead frame having the lead fingers 54' extending over the active surface 14 of the semiconductor device 10 may be used rather than a conventional lead frame 50. In such instance, the wire bonds are made in the same manner as described hereinbefore with a ball-type bond 34' being made to bond wire 30' to lead finger 54'.

Figure 4:
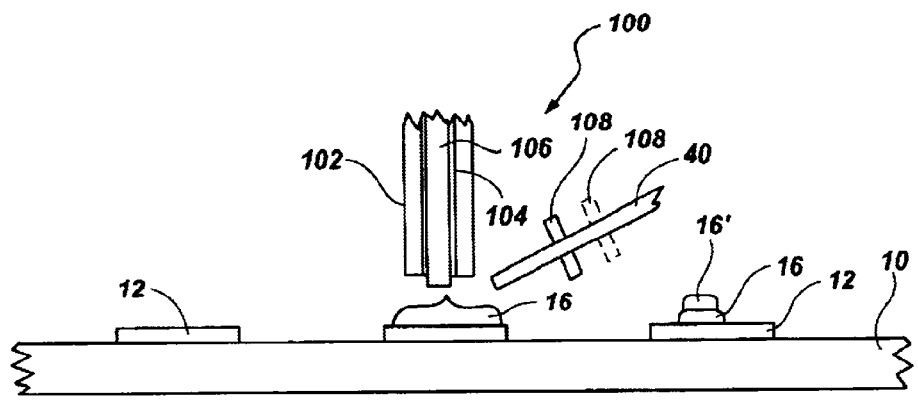
FIG. 4 is a view of an apparatus for forming wire bumps on the bond pads of semiconductor device.

Referring to drawing FIG. 4, a wire bonding and wire bump flattening apparatus 100 is schematically illustrated. The apparatus 100 comprises a bond head 102 having a concentrically located punch 106 located in the bore 104 thereof and one or more wire clamps 108 to hold and feed wire 40 to be used for forming the wire bumps 16 on the bond pad 12 of a semiconductor device 10. To form a wire bump 16 on a bond pad 12, the wire 40 is fed into contact with the bond pad 12, the bond head 102 is brought into contact with the wire 40 and bond pad 12, and the bond head 102 is activated. After the application of sufficient energy to the wire 40 to bond the end thereof to the bond pad 12, the wire clamps 108 grasp and pull the wire away from the bond pad 12, causing the wire to sever, leaving the wire bump 16 bonded to the bond pad 12. Subsequently, the bond head 102 is raised and the punch activated to flatten the wire bump 16 formed on the bond pad 12. As illustrated, the bond pad 12 may have a wire bump 16 formed thereon with the wire bump 16 having another wire bump 16' formed thereon, any number of wire bumps, such as 16, 16', etc., being formed on the bond pad 12.

Figure 5:
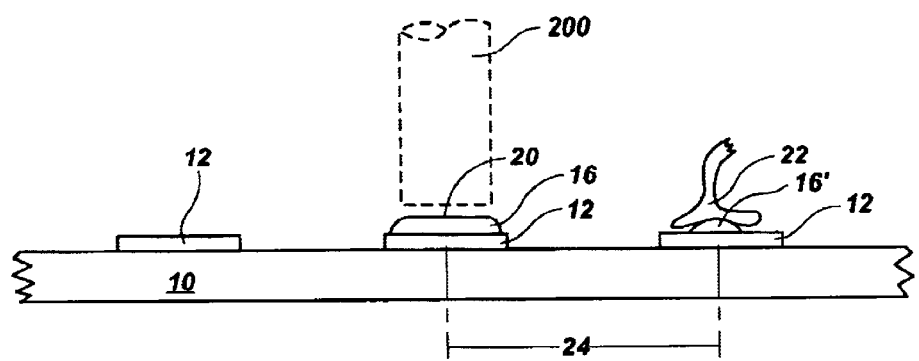
FIG. 5 is a view of a wire bond on a wire bump on the bond pad of a semiconductor device.

Referring to drawing FIG. 5, a wire bump 16 is illustrated having a flattened upper surface 20 thereon after having been flattened by the punch 106 of the bond head 102.

Also illustrated in drawing FIG. 5 is an unflattened, generally hemispherically shaped wire bump 16' located on a bond pad 12 of the semiconductor device 10. By using a hemispherically shaped wire bump 16', a subsequent wire bond 22 may be made thereto wherein the wire bond 22 is larger in diameter than the wire bump 16' with a satisfactory wire bond being formed as the hemispherical shape of the wire bump 16' provides the maximum surface area for wire bonding while minimizing the geometric volume of the wire bump 16'. In this manner, the bond pads 12 of the semiconductor device 10 may be placed on a smaller pitch 24 than using conventional ball-type wire bonds while maintaining adequate and satisfactory bond strength of the wire bond 22 to the wire bump 16' and the bond pad 12. The wire bump 16 may be flattened by the use of a well known tool 200 (shown in dashed lines) which employs heat and an ultrasonic action in a scrubbing motion to flatten the wire bump 16 for the attachment of a wire bond 22 thereto.

Figure 6:
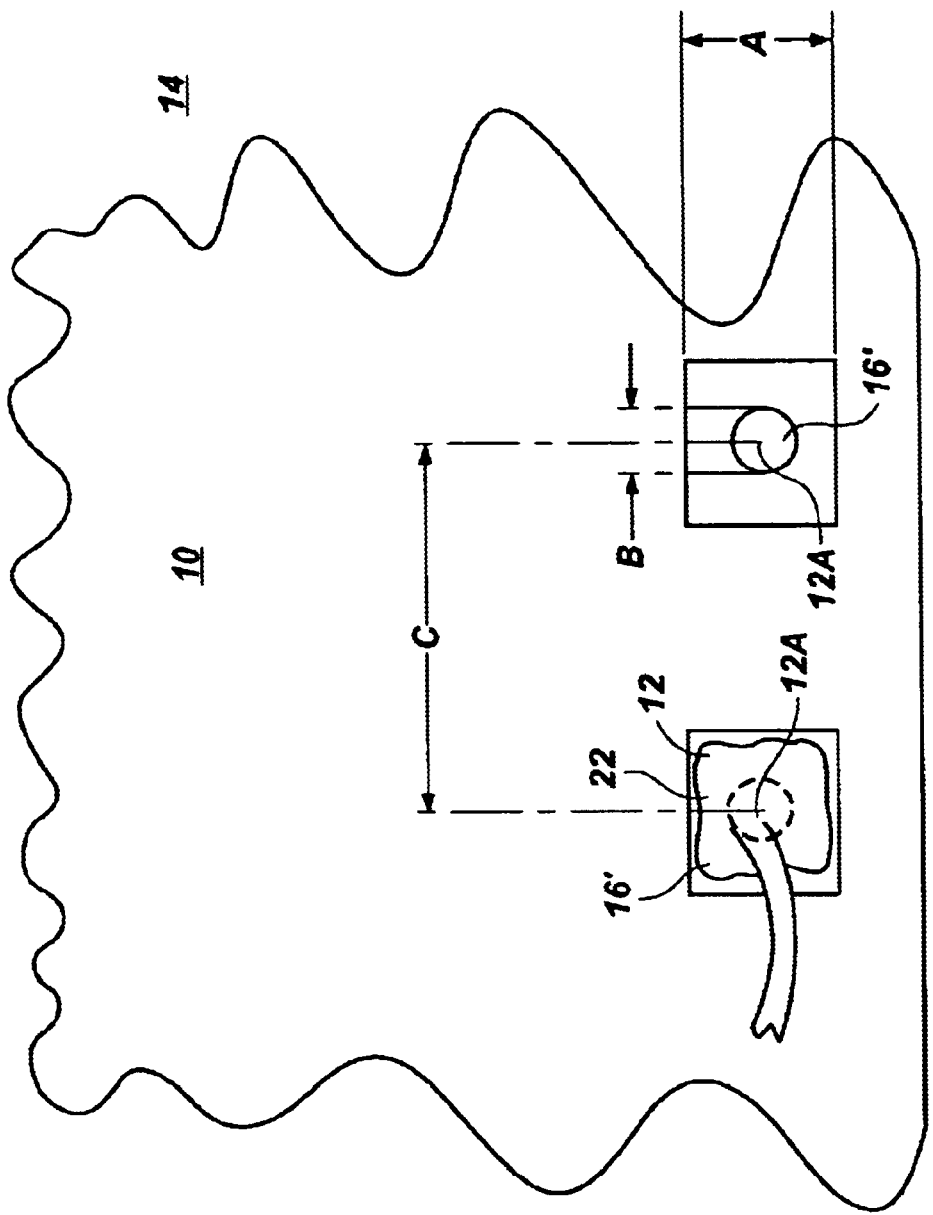
FIG. 6 is a top view of a wire bond on a wire bump on the bond pad of a semiconductor device.

Referring to drawing FIG. 6, bond pads 12 are illustrated having a generally hemispherically shaped wire bump 16' located thereon. In one instance, the bond pad 12 having generally hemispherically shaped wire bump 16' thereon is illustrated having wire bond 22 secured to the bond pad 12 and wire bump 16' with the wire bond 22 substantially covering the entirety of the bond pad 12. By using a generally hemispherically shaped wire bump 16' on the bond pad, additional area for the subsequent wire bond 22 is provided on the bond pad 12, thereby allowing the use of a smaller bond pad 12 than would typically be necessary for wire bonding, thereby, in turn, allowing the adjacent bond pads 12 to be placed on a closer pitch "C" on the semiconductor device 10. The pitch "C" is generally defined as the distance between adjacent centers 12' of adjacent bond pads 12. The size of the generally hemispherically shaped wire bump 16' in relation to the size of the bond pad 12 may vary, depending upon the subsequent wire bond 22 characteristics which are desired. As an example, if a bond pad 12 is provided having a size of three (3) mils., a wire bump 16' having a general size of 1 or 2 mils. may be used if forming the wire bump 16' from gold wire. In this manner, for fine pitch applications of bond pads 12, the wire bond 22 is kept away from the surrounding circuitry of the semiconductor device 10 and the wire bump 16' may be flattened with additional force and power as applied during forming the wire bond 22 without the risk of damaging the surrounding circuitry of the semiconductor device 10 while forming a high strength wire bond 22.

It will be understood that changes, additions, deletions, and modifications may be made to the present invention which are intended to be within the scope of the claimed invention. Such are the use of a single layer bond pad, the shape of the wire bump, the relative size of the wire bond to the wire bump, etc.

What is claimed is:

1. A method for a semiconductor device assembly having a semiconductor die having at least one bond pad, the at least one bond pad having at least two layers of different metals, said method comprising:

providing one of a piece of wire and a first wire;

forming a bump on said at least one bond pad of said semiconductor die using said one of a piece of wire and said first wire;

flattening said bump;

connecting one end of a second wire to said bump using a ball-type wire bond, said ball-type wire bond having a diameter greater than a diameter of said bump;

providing a lead frame having at least one lead finger thereon; and connecting another end of said second wire to a portion of said at least one lead finger using a wire bond.

2. A method for a semiconductor device assembly, said method comprising:

providing a semiconductor device having at least one bond pad thereon;

providing one of a piece of wire and an end of a wire;

forming a wire bump on said at least one bond pad on said semiconductor device using said one of a piece of wire and said end of a wire;

flattening said wire bump;

connecting one end of a wire to said wire bump using a ball-type wire bond, said ball-type wire bond having one of a larger diameter and size than said wire bump;

providing a lead frame having at least one lead finger thereon; and connecting another end of said wire to a portion of said at least one lead finger using a wire bond.

3. A method for a semiconductor device assembly having a semiconductor die having at least one bond pad, said method comprising:

providing one of a piece of wire and an end of a wire;

forming a wire bump of gold on said at least one bond pad of said semiconductor die using said one of a piece of wire and said end of a wire;

flattening said wire bump before connecting one end of a wire thereto;

connecting said one end of said wire to said wire bump using a ball-type wire bond, said ball-type wire bond having a larger size than that of said wire bump on said at least one bond pad;

providing a lead frame having at least one lead finger thereon; and connecting another end of said wire to a portion of said at least one lead finger using a wire bond.

4. A method for a semiconductor device assembly having at least one semiconductor die having at least one bond pad, said method comprising:

provide one of a piece of substantially gold wire and an end of a substantially gold wire;

forming a wire bump on at least a portion of said at least one bond pad of the semiconductor die using said one of a piece of substantially gold wire and an end of said substantially gold wire;

flattening said wire bump before connecting one end of a wire thereto;

connecting said one end of said wire to said wire bump using a ball-type wire bond, the one end of said wire having a larger size than said wire bump on said at least one bond pad;

providing a lead frame having at least one lead finger thereon; and connecting another end of said wire to at least a portion of said at least one lead finger using a wire bond.

* * * * *